(12) United States Patent
Lustenberger

(10) Patent No.: US 10,073,140 B2
(45) Date of Patent: Sep. 11, 2018

(54) SAFETY CIRCUIT MONITORING USING ALTERNATING VOLTAGE

(71) Applicant: Inventio AG, Hergiswil (CH)

(72) Inventor: Ivo Lustenberger, Buttisholz (CH)

(73) Assignee: INVENTIO AG, Hergiswil (CH)

( * ) Notice: Subject to any disclaimer, the term of this patent is extended or adjusted under 35 U.S.C. 154(b) by 605 days.

(21) Appl. No.: 14/767,375

(22) PCT Filed: Jan. 20, 2014

(86) PCT No.: PCT/EP2014/050979
§ 371 (c)(1),
(2) Date: Aug. 12, 2015

(87) PCT Pub. No.: WO2014/124780
PCT Pub. Date: Aug. 21, 2014

(65) Prior Publication Data
US 2016/0033577 A1 Feb. 4, 2016

(30) Foreign Application Priority Data

Feb. 12, 2013 (EP) ..................................... 13154866

(51) Int. Cl.
| | |
|---|---|
| *B66B 1/34* | (2006.01) |
| *G01R 31/327* | (2006.01) |
| *B66B 5/00* | (2006.01) |
| *B66B 13/22* | (2006.01) |
| *G01R 31/28* | (2006.01) |

(52) U.S. Cl.
CPC .......... *G01R 31/327* (2013.01); *B66B 5/0031* (2013.01); *B66B 13/22* (2013.01); *G01R 31/2827* (2013.01)

(58) Field of Classification Search
CPC ..... B66B 5/0031; B66B 13/22; G01R 31/327; G01R 31/2827
USPC ....... 187/247, 387, 389, 316, 317, 391–393; 49/26, 28
See application file for complete search history.

(56) References Cited

U.S. PATENT DOCUMENTS 3,873,902 A * 3/1975 Burch .................. B65G 1/0421
187/291
4,307,793 A * 12/1981 Caputo ..................... B66B 1/30
187/297

(Continued)

FOREIGN PATENT DOCUMENTS

| CN | 1291584 A | 4/2001 |
| CN | 101151203 A | 3/2008 |

(Continued)

*Primary Examiner* — Anthony Salata
(74) *Attorney, Agent, or Firm* — William J. Clemens; Shumaker, Loop & Kendrick, LLP

(57) ABSTRACT

A monitoring system for people-transporting systems, which systems are in the form of an elevator, escalator or moving walkway, includes at least one interrogation device and at least one safety switch that is connected to the interrogation device via an electrical safety circuit and is used for monitoring an equipment of the people-transporting device. A current direction-dependent unit is arranged in the electrical safety circuit. Furthermore, the interrogation device applies a test voltage with an alternating polarity to the electrical safety circuit. Furthermore, a people-transporting system having such a monitoring system is provided.

15 Claims, 3 Drawing Sheets

(56) References Cited

U.S. PATENT DOCUMENTS

| | | | | |
|---|---|---|---|---|
| 4,713,595 A * | 12/1987 | Yonemoto | ............... | B66B 1/308 |
| | | | | 187/296 |
| 6,193,019 B1 | 2/2001 | Sirigu et al. | | |
| 7,775,327 B2 * | 8/2010 | Abraham | ................ | B66B 1/308 |
| | | | | 187/288 |
| 8,230,977 B2 * | 7/2012 | Thumm | ................... | B66B 1/34 |
| | | | | 187/247 |
| 8,413,765 B2 * | 4/2013 | Stratmann | ............. | B66B 5/0031 |
| | | | | 187/247 |
| 8,672,099 B2 * | 3/2014 | De Coi | ................... | B66B 13/22 |
| | | | | 187/316 |
| 8,820,482 B2 * | 9/2014 | De Coi | ................ | B66B 5/0031 |
| | | | | 187/247 |
| 8,997,941 B2 * | 4/2015 | Abad | ..................... | B66B 13/22 |
| | | | | 187/247 |

FOREIGN PATENT DOCUMENTS

| | | | |
|---|---|---|---|
| CN | 101563282 A | 10/2009 | |
| EP | 0903314 A1 | 3/1999 | |
| EP | 1440930 A2 | 7/2004 | |

\* cited by examiner

SAFETY CIRCUIT MONITORING USING ALTERNATING VOLTAGE

FIELD

The invention relates to a monitoring system for passenger transport installations, which are designed as an elevator, escalator or moving walkway, to such a passenger transport installations and to a method for such a passenger transport installations. In particular, the invention relates to the field of elevator installations.

BACKGROUND

A device for monitoring doors, which are provided on several floors, of an elevator installation is known from U.S. Pat. No. 6,193,019 B1. In that case, a safety circuit with a chain of switches arranged at the locks of the doors is provided. A resistor is connected in parallel with each of these switches. The respective resistance is bridged over when the switch is closed. The resistance values are formed as a product of a power of two and a reference resistance. The exponent, which is a non-negative integral number, in that case corresponds with the floor on which the door to which the lock with the associated resistance relates is located. If one or more switches are open, then it can thus be calculated from the sum of the resistances at the open switches—which indicate the total resistance with respect thereto of the open safety circuit—which switches are open. This can be output by way of a suitable display device.

The device known from U.S. Pat. No. 6,193,019 B1 for monitoring the doors of an elevator installation has the disadvantage that a significant disturbance, such as a short-circuit, can so impair the functioning of the safety circuit that one or more open locks are wrongly recognized as closed.

A door closure for a door of an elevator is known from EP 1 440 930 A2. The known door closure comprises a housing and a bolt which with respect to the door is transferrable to a locking setting and to a release setting. The bolt is mounted in the housing. The closure comprises a manually actuable emergency unlocking means to transfer the bolt to its release setting, wherein the emergency unlocking means comprises an entrainer which is actuable by an emergency unlocking key to transfer the bolt to the release setting. In addition, provided at or in the housing is a constrainedly opening safety switch or at least a part of a corresponding electrical safety circuit and a manually actuable entrainer, which is associated therewith, for actuation of the safety switch or the safety circuit. In that regard, the door closure can be constructed in such a way that through actuation of the emergency unlocking means initially the safety switch is actuated and subsequently thereto in time thereto the bolt is transferred to its release setting. A normal operation of an item of equipment associated with the door can be interrupted and reinstated by a safety circuit through switching of the safety switch.

Particularly in the case of elevator installations having a reduced shaft head or no shaft head in the elevator shaft, monitoring of door closures, particularly triangle locks, of shaft doors is required. It can thereby be ascertained whether anybody could access the car roof. On opening of a triangle lock, a safety switch is opened, which interrupts a safety circuit. If the safety switch has, as described in EP 1 440 930 A2, a detent function then the elevator installation is stopped until a service engineer places this back in operation after an appropriate investigation. However, if, for example, a short-circuit is now present in the region of the opened switch then the opened setting is not recognized and serious accidents can arise.

SUMMARY

An object of the invention is to indicate a monitoring device for passenger transport installations, which are designed as an elevator, escalator or moving walkway, such a passenger transport installation and a method for monitoring such a passenger transport installation, which are of improved design. In particular, it is an object of the invention to indicate a monitoring device for transport installations, which are designed as an elevator, escalator or moving walkway, for persons, such a transport installation for persons and a method for monitoring such a transport installation for persons, which enables improved monitoring of at least one item of equipment of the passenger transport installation, in which case, in particular, disturbances of the electrical safety circuit can be recognized.

The object is fulfilled by a monitoring system for passenger transport installations, which are designed as an elevator, escalator or moving walkway. The monitoring system comprises at least one interrogation device and at least one safety circuit, which is connected with the interrogation device by way of an electrical safety circuit and which serves for monitoring an item of equipment of the passenger transport installations. The safety switch has a first switch setting and a second switch setting. In order to check the electrical safety circuit, a unit with current direction dependence is arranged in the electrical safety circuit. The unit with current direction dependence has an electrical characteristic with current direction dependence. It therefore blocks or reduces the current flow in dependence on polarity or in one of the two possible throughflow directions. A test voltage with an alternating polarity can be applied to the electrical safety circuit by means of the interrogation device. In addition, at least one state of the electrical safety circuit which is determinable by the test voltage can be detected by the interrogation device, wherein at least one status signal can be generated from the at least one state detected by the interrogation device and from the switch setting of the safety switch belonging to this state. It is advantageous that in a first switch setting or a first sequence of the switch settings of the at least one safety switch the electrical safety circuit is closed by way of the unit with current direction dependence.

The feature "determinable state" describes the reaction of the safety circuit to the application of the test voltage, which is detectable by the interrogation unit. In total, four states can be detected. If a test voltage with alternating polarity, for example a sinusoidal test voltage, is applied to the electrical safety circuit the interrogation device detects as first detectable state, for example, only the positive half wave of the test voltage. A second determinable state is represented by detection of exclusively negative half waves. Detection of the total test voltage (positive and negative half waves) can be regarded as a third determinable state, whilst the fourth determinable state is represented by the fact that notwithstanding application of the test voltage to the safety circuit no test voltage is detectable by the interrogation device.

The four determinable states make it possible to generate statements about the state of the safety circuit and to output these statements in the form of a status signal. These statements can, in particular, be made unambiguous if the switch setting of the safety circuit is also known. From the fourth determinable state it is possible, for example, to verify that a safety switch of the safety circuit has an open switch setting. In addition, from the fourth determinable state it is also possible to deduce that at least one element of the safety circuit is defective and interrupts this circuit when the safety switch records a closed switch setting. From the third determinable state it can be derived that the safety circuit has a short-circuit, for example by way of the switch or by way of the unit with current direction dependence. Insofar as only one unit with current direction dependence is used in the safety circuit then depending on the respective polarity of the same only either the first or the second determinable state arises in the safety circuit when the safety switch has a closed switch setting and the safety circuit is intact. The first determinable state and the second determinable state are therefore equivalent.

Depending on the respective design of the monitoring device it is possible, for example, to automatically conduct the status signal from the interrogation device to a central control by way of a bus system or be interrogated by this at the interrogation device.

In advantageous manner, the interrogation device is designed to apply the test voltage in the form of an alternating voltage to the electrical safety circuit continuously or at specific intervals in time. For example, the test voltage can be formed from individual, preferably rectangular, voltage pulses, which are applied at alternating polarity to the electrical safety circuit. It can thereby be checked whether the safety circuit shows the dependence on the polarity attributable to the unit with current direction dependence. Disturbances of the safety circuit can thereby also be recognized.

It is also advantageous if a test routine for the interrogation device can be carried out by a user, particularly a service engineer, by way of a control device. In the test routine, the test voltage with the alternating polarity is applied to the electrical safety circuit in each switch setting to be tested or sequence of switch settings to be tested of the at least one safety switch. As a result, the safety switch can in addition be tested in its function with respect to the possible switch settings.

In that regard, it is additionally advantageous if the unit with current direction dependence is arranged at the last safety switch, if the last safety switch is the sole safety switch of the safety circuit or the last safety switch in a series of several safety switches arranged in a forward line of the safety circuit, and if in the first switch setting of the first safety switch or the first sequence of the switch settings of the series of several safety switches the forward line is connected with a return line by way of the current-direction-dependent unit for closing of the electrical safety circuit. It is made possible by the unit with current direction dependence to check whether the forward line is closed by way of the safety switch or the series of several safety switches. In that regard, the case that the forward line is closed by the closed safety switch can be distinguished from a case in which, due to a disturbance, the safety switches no longer lead to the designed behavior. For example, the disturbance can consist of a short-circuit between the forward line and the return line, so that one or more safety switches are bridged over. Opening of a bridged-over safety switch then no longer leads to electrical opening of the safety circuit. However, due to the bridging-over, the unit with current direction dependence is also bridged over. The test voltage with alternating polarity thus, in the case of this disturbance, no longer leads to behavior, which is dependence on the polarity or the current direction, of the safety circuit as would be the case through the bridged-over unit, which has current direction dependence, without a disturbance. It is thus recognized that a disturbance of the electrical safety circuit, in particular in this instance the short-circuit, is present.

It is advantageous if in the series with several safety switches the unit with current direction dependence is arranged only at the last safety switch. If such a series with several safety switches is present, then it is thereby possible to check in advantageous manner with only a single unit with current direction dependence whether due to a disturbance, such as a short-circuit, one or more safety switches are bridged over and thus non-functioning. Additionally or alternatively, it is advantageous if in the second switch setting of the last safety switch or in another sequence of the switch settings of the series of several safety switches differing from the first sequence the forward line is interrupted. When a safety switch is opened, the safety circuit is thus interrupted if no disturbance is present. In such an embodiment, a signal interruption then arises regardless of the polarity of the test voltage. Thereagainst, when the safety switches are closed the current-direction-dependent characteristic can be checked. If this current-direction-dependent electrical characteristic cannot be recognized, then the interrogation device recognizes that a disturbance is present. In every case, whether a disturbance is present or not, the interrogation unit can generate a corresponding status signal.

In particular, it can be checked by one polarity of the test voltage whether all safety switches are closed or whether at least one safety switch is open and it can be checked by both polarities of the test voltage whether a disturbance of the electrical safety circuit is present. In that case, in particular, a short-circuit is to be regarded as a disturbance. This is possible by a design of the unit with current direction dependence in the form of a diode. The possibility thereby arises of realizing both interrogation of the safety circuit and checking of the functional capability of the safety circuit by a test voltage, which can be generated in comparatively simple manner, and an electronic evaluating system, which can be designed in comparatively simple manner, of the interrogation device.

In a further possible embodiment it is advantageous if a further unit, which has current direction dependence, with a current-direction-dependent electrical characteristic is provided and if in a second switch setting of the last safety switch or in another sequence of the switch settings of the series of several safety switches differing from the first sequence a part of the forward line connected with the interrogation device is connected with a bridging-over line so that the unit with current direction dependence is bridged over and the bridging-over line is connected with the return line by way of the further unit with current direction dependence. As a result, additional interrogation possibilities for the interrogation device are made possible, because if at least one safety switch is open it can now be checked whether the safety circuit displays the current-direction-dependent characteristic of the unit with current direction dependence or the current-direction-dependent characteristic of the further unit with current direction dependence.

In that regard, it is particularly advantageous if it is checked by one polarity of the test voltage whether all safety switches are closed and by the other polarity whether at least one safety switch is open, and if it is checked by both polarities of the test voltage whether a disturbance of the electrical safety circuit is present. In particular, it is possible in that regard to recognize as disturbances whether a short-circuit is present or whether a line breakage is present. In that case it is additionally of advantage if the unit with current direction dependence and the further unit with current direction dependence block current flow through the return line in the case of mutually opposite polarities of the test voltage. If the unit with current direction dependence as a consequence of the given first switch setting or the first sequence of switch settings lies in the electrical current path of the safety circuit then, for example, a current flow arises in the case of positive polarity of the test voltage, whereas the current flow is blocked in the case of negative polarity of the test voltage. On the other hand, in the second switch setting or another sequence of switch settings the further unit with current direction dependence lies in the current flow of the safety circuit so that, for example, the current flow is blocked in the case of positive polarity, whereas a current flow is present in the case of negative polarity. It is thus possible to clearly differentiate between an open safety circuit and a closed safety circuit. Moreover, also possible in both cases is interrogation whether a disturbance is present, because in the case of a line breakage there is no current flow regardless of the polarity of the test voltage. Thereagainst, in the case of a short-circuit there is always a current flow regardless of the polarity of the test voltage.

It is advantageous if the unit with current direction dependence is arranged directly at a first output of the last safety switch. In particular, the unit with current direction dependence can be designed as a diode. It is then possible, for example, to secure a terminal of the diode directly to a terminal of the switch or the like. Occurrence of a short-circuit between the first output of the last safety switch and the unit with current direction dependence is thus prevented by mechanical means. In fact, it is also conceivable for the unit with current direction dependence to be arranged at a spacing from the first output of the last safety switch, but then such a problem scenario has to be reliably prevented by other means. Also advantageous is design of the last safety switch together with a diode, which is mounted directly at a terminal of the first output of the last safety switch, as a constructional unit. In particular, the unit with current direction dependence can thus be designed as a diode or at least comprise a diode.

In the case of a design in which a bridging-over line is provided, it is correspondingly advantageous if the further unit with current direction dependence is arranged directly at the second output of the last safety switch. In that regard, not only the unit with current direction dependence, but also the further unit with current direction dependence form, together with the last safety switch, a constructional unit. Moreover, it is advantageous if the further unit with current direction dependence is formed by a diode or at least comprises a diode.

It is also advantageous if the monitoring device comprises a decentralized control device which comprises the interrogation device or is arranged at the interrogation device and if the decentralized control device is connected with a central control by way of a bus system. For example, such a decentralized control device can be present on each floor and, together with the respective interrogation device, monitors and interrogates one or more safety switches. In the case of a fault, for example, the floor can then be reported to the central control.

In a further possible embodiment it is advantageous if a control device is present which comprises the interrogation device or is arranged at the interrogation device and if the safety switch is arranged at the interrogation device or remote therefrom. In this embodiment, the safety switch can, in particular, be arranged to be spread over several floors. In that regard, in a given case a single control device which can be arranged at a control or integrated in a control is sufficient.

Thus, in particular, reliable interrogation of a triangle lock or another form of lock is possible by way of a safety switch of the safety circuit, wherein depending on the respective design also a single twin-wire line can be used. In that case, interruptions and short-circuits on the line can be reliably recognized. Moreover, it is possible to reliably recognize an open triangle lock or an open switch in every fault case. For this purpose, a unit with current direction dependence and designed as, in particular, a diode can be placed as close as possible to a switch contact of the triangle lock. Interrogation of the switch state can then take place by way of a positively and negatively applied feed voltage, from which the test voltage results. This can take place sporadically or with rapidly changing frequency. If the test voltage is applied in pass direction of the diode, the closed state of the safety switch is then recognized. In blocking direction, a current flow for both polarities can be recognized in the case of a short-circuit of the line. Thereagainst, in the case of an interruption or an open safety switch, interrupting can be recognized. It is thus possible to differentiate all states and immediately recognize faulty behavior. In addition, a defect in the unit with current direction dependence, particularly a defect of the diode, can be reliably recognized, wherein the defect can be a short-circuit or an interruption. If, in addition, a line interruption is to be recognized then the safety switch can be used in the form of changeover switches with two outputs. In that event, in particular, the two outputs of the last safety switch can be connected with the return line by way of two anti-parallel diodes, of which one is arranged at the first output and the other at the second output. Thus, all four mentioned states can be differentiated.

The interrogation device or a control device with the interrogation device can thus also be arranged centrally in a control, particularly in an elevator control. However, the interrogation device or the control device can also be provided on each floor and, for example, be integrated in an RFID card reader on the respective floor and conjunctively use the interface thereof to the bus. In a further possible embodiment the interrogation device can be installed, on each floor or each floor, in the triangle lock and be connected with the bus by way of an individual interface.

Thus, a space-saving design also arises as an advantage. A further advantage is that the solution can be realized economically, since in a given case only an opener is required instead of a changeover switch and in a given case only two wires can suffice. Moreover, an improved fault recognition can be realized.

Furthermore, improved processing and more intelligent reaction, particularly in the region of the control, can be achieved if the obtained data are linked with, for example, an instantaneous car position or other items of information.

Moreover, it is possible to prevent, by mechanical means, occurrence of a short-circuit between the output of the safety switch and the unit with current direction dependence, particularly the diode, in that a direct arrangement, particularly in a constructional unit, is realized. In that regard, it can be ensured in terms of construction that the safety switch when the triangle lock is open is reliably interrupted at least on the forward line, which corresponds with a constrained opening.

DESCRIPTION OF THE DRAWINGS

Preferred embodiments of the invention are explained in more detail in the following description with reference to the accompanying drawings, in which corresponding elements are provided with corresponding reference numerals and in which.

DETAILED DESCRIPTION

Figure 1:
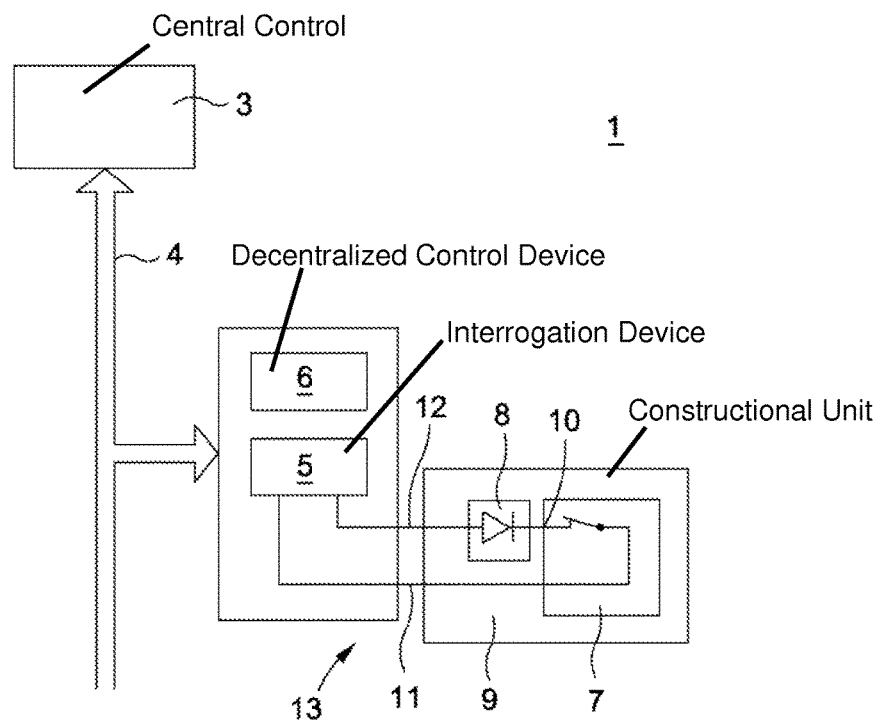
FIG. 1 shows a monitoring system for a passenger transport installation in a schematic illustration, in the manner of a detail, in correspondence with a first embodiment of the invention.

FIG. 1 shows a monitoring system 1 for a passenger transport installation, which is designed as an elevator or elevator installation, an escalator or a moving walkway, in a schematic illustration in the manner of a detail in correspondence with a first embodiment. Such a passenger transport installation 2 is illustrated in greater detail in FIG. 5.

The monitoring installation 1 of FIG. 1 comprises a central control 3, which can be integrated in an elevator control or the like or is arranged at an elevator control or the like. The central control 3 is in that case coupled to a bus system 4. The bus system 4 can in that regard serve as a common bus system for all data or signals and status signals of the passenger transport installation. However, it can also be provided as an exclusive bus system 4 for the monitoring system 1.

The monitoring system 1 comprises an interrogation device 5 and a decentralized control device 6. The interrogation device 5 is in that case arranged at the decentralized control device 6. The interrogation device 5 can also be integrated in the decentralized control device 6. The interrogation device 5 and the decentralized control device 6 are directly or indirectly connected with the bus system 4.

The monitoring system 1 additionally comprises a safety switch 7 and a unit 8, which has current direction dependence, with a current-direction-dependent electrical characteristic. In this embodiment, the unit 8 with current direction dependence is formed by a diode 8. The unit 8 with current direction dependence in that case forms together with the safety switch 7 a constructional unit 9. A terminal of the diode 8 can then be directly mounted on an output of the safety switch 7. Together with a forward line 11 and a return line 12 an electrical safety circuit 13 is formed, which can be interrogated with respect to its state by way of the interrogation device 5.

If the safety switch 7 is open, then the electrical safety circuit 13 is interrupted so that current flow through the electrical safety circuit is not possible. There is thus no current flow regardless of the polarity of a test voltage applied to the electrical safety circuit 13. The interrogation device 5 thereby recognizes that an item of equipment 15 (FIG. 5), in particular a door lock 15, has been opened. The item of equipment 15 of the passenger transport installation 2 can thus be monitored.

If the safety switch 7 is closed, then a current flow is generated in the case of alternating polarity of the test voltage only in the pass direction of the diode 8. The interrogation device 5 can thereby detect that the safety switch 7 is closed. In addition, the interrogation device 5 can thereby detect that there is no short-circuit between the forward line 11 and the return line 12, because in the case of a short-circuit between the forward line 11 and the return line 12 a current flow arises regardless of the polarity of the test voltage.

The interrogation device 5 can thus reliably detect a disturbance, particularly a short-circuit, of the electrical safety circuit 13. A reliable detection of opening of the safety switch 7 is thus possible, since the characteristics of the electrical safety circuit 13 when the safety switch 7 is closed and of the electrical safety circuit 13 when there is a short-circuit can be reliably distinguished from one another. Disturbances or a fault-free state of the electrical safety circuit 13 can thus be detected by the interrogation device 5 and output, for example, in the form of a status signal to the control device 6.

Figure 2:
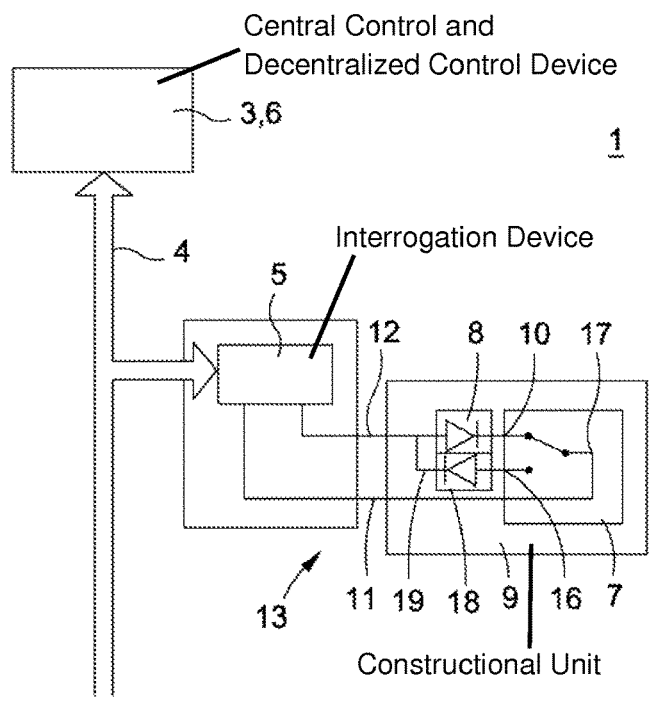
FIG. 2 shows a monitoring system for a passenger transport installation in a schematic illustration, in the manner of a detail, in correspondence with a second embodiment of the invention.

FIG. 2 shows a monitoring system 1 of the passenger transport installation 2 (FIG. 5) in a schematic illustration in the manner of a detail in correspondence with a second embodiment. In this embodiment the control device 6 is designed as a central control device 6 and integrated in the central control 3. The interrogation device 5 is connected with the central control device 6 by way of the bus system 4. The safety switch 7 in this embodiment has a first output 10 and a second output 16, which are connected in alternation with an input 17 of the safety switch 7. In the first switch setting, in which the input 17 is connected with the first output 10, the forward line 11 is connected with the return line 12 by way of the unit 8 with current direction dependence. This means in this embodiment that the item of equipment 15 is closed, which does not require a safety-relevant action. In a second switch setting of the safety switch 7, in which the input 17 is connected with the second output 16, the forward line 11 is connected with the return line 12 by way of a further unit 18, which has current direction dependence, with a current-direction-dependent electrical characteristic and a bridging-over line 19. In that case, the bridging-over line 19 bridges over the unit with current direction dependence in the second switch setting of the safety switch 7.

In this embodiment the further unit 18 with current direction dependence is formed by a second diode 18. In this case, the first diode 8 and the second diode 18 are, when the safety switch 7 is appropriately switched, arranged in opposite sense (anti-parallel) relative to one another with respect to a current flow through the electrical safety circuit 13. However, depending on the switch setting of the safety switch 7 only one of the diodes 8, 18 lies in the closed current circuit.

The further unit 18 with current direction dependence is arranged directly at the second output 16 of the safety switch 7. In this embodiment, the unit 8 with current direction dependence, the further unit 18 with current direction dependence and the safety switch 7 form a constructional unit 9. For example, a terminal of the diode 18 can be mounted directly on the second output 16 of the safety switch 7. As a result, a disturbance, particularly a cable breakage, between the units 8, 18 with current direction dependence and the safety switch 7 is excluded from the outset.

In this embodiment the units 8, 18 with current direction dependence are formed by a first diode 8 and a second diode 18. In a modified embodiment the units 8, 18 with current direction dependence can, however, also comprise other or additional components, particularly resistances. Also conceivable is an embodiment in which, for example, the unit 8 with current direction dependence comprises oppositely oriented diodes, whereby when the current circuit is closed different resistance values, for example, can be interrogated in dependence on the polarity of the test voltage. For that purpose, resistances of different size can be connected in series with the two diodes of opposite sense of a single unit 8 with current direction dependence. In corresponding manner, a current-direction-dependent characteristic of that kind can refer not only to an ohmic resistance, but also to an impedance. Moreover, it is thus evident that the current-direction-dependent characteristic of the unit 8 with current direction dependence does not necessarily mean blocking of the current, thus an infinitely large resistance, for one of the two polarities of the test voltage.

In corresponding manner, the further unit 18 with current direction dependence can also consist not only of a diode 18, but also of additional or other components.

In the case of the embodiment, which is described by way of FIG. 2, of the units 8, 18 with current direction dependence it can be checked by one polarity of the test voltage, in which the first diode 8 is switched to pass direction, whether the current circuit is closed. If, in addition in the case of opposite polarity of the test voltage the current circuit is blocked, then neither a line breakage nor a short-circuit is present and the interrogation device 5 thus detects the first switch setting of the safety switch 7 in disturbance-free operation.

If a short-circuit is present, then a current flow arises not only with positive polarity, but also with negative polarity, so that a disturbance, namely a short-circuit, is detected. If, thereagainst, a current flow arises neither with positive polarity nor with negative polarity, then a line breakage is present.

On the other hand, if a current flow arises in the case of a polarity in which the second diode 18 is switched to pass direction and there is no current flow in opposite direction then neither a short-circuit nor a line breakage is present and the interrogation device 5 detects that the safety switch 7 is in the second switch setting.

Thus, in this embodiment the interrogation device 5 can detect each of the four mentioned states and also differentiate these from one another.

In the case of the embodiments described by way of FIGS. 1 and 2 the safety circuit 7 is respectively the sole and thus necessarily technically the last safety switch 7. However, it is also possible for more than one safety switch 7 to be arranged in an electrical safety circuit 13, which can be interrogated by the interrogation device 5. Disturbances or a fault-free state of the electrical safety circuit 13 can thus be detected by the interrogation device 5 and, for example, output in the form of a status signal to the control device 6.

Figure 3:
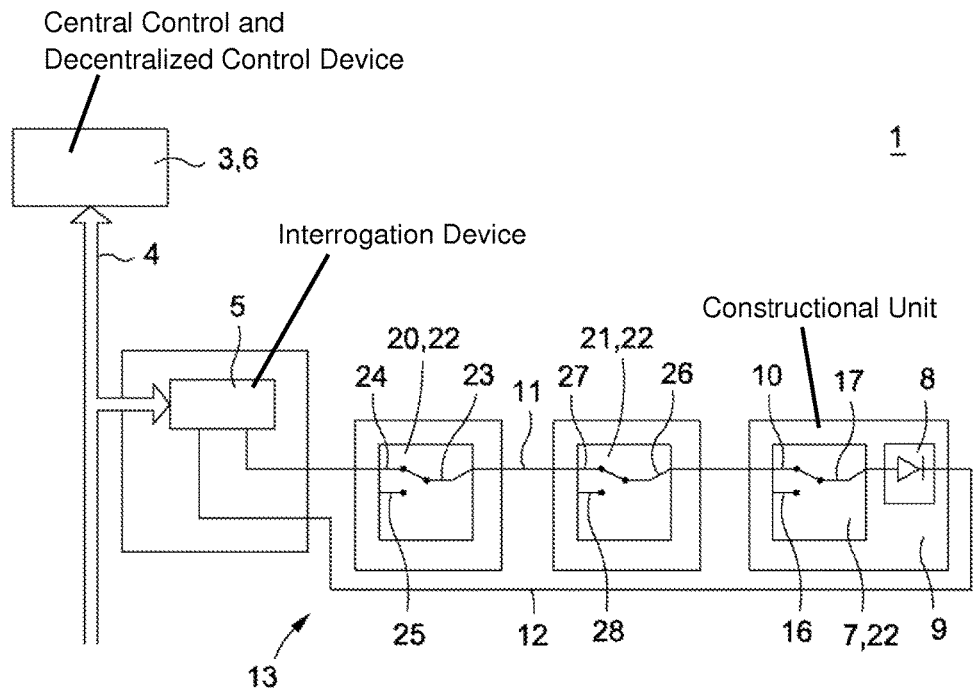
FIG. 3 shows a monitoring system for a passenger transport installation in a schematic illustration, in the manner of a detail, in correspondence with a third embodiment of the invention.

FIG. 3 shows a monitoring system 1 for the passenger transport installation 2 (FIG. 5) in a schematic illustration in the manner of a detail in correspondence with a third embodiment. In this embodiment the interrogation device 5 is connected with the central control device 6 by way of the bus system 4. In addition, the safety switch 7 has an output 10, whereas the output 16 is open. Moreover, further safety switches 20, 21 are provided. The safety switches 7, 20, 21 form a series 22 of safety switches 7, 20, 21, which are arranged in the forward line 11. The safety switch 7 is the last safety switch 7 in the series 22, which is connected with the return line 12 by way of the unit 8 with current direction dependence.

The safety switch 20 has an input 23 and outputs 24, 25, the output 25 being open. The safety switch 21 has an input 26 and outputs 27, 28, the output 28 being open.

A first sequence of switch settings of the series 22 of safety switches 7, 20, 21 is illustrated in FIG. 3. In this first sequence all safety switches 7, 20, 21 are closed. This means that in the case of the safety switch 7 the input 17 is connected with the output 10, in the case of safety switch 20 the input 23 is connected with the output 24 and in the case of the safety switch 21 the input 26 is connected with the output 27. The current circuit in the electrical safety circuit 13 is therefore closed.

If the test voltage with the polarity is applied to the electrical safety circuit 13 in which the diode 8 lies in pass direction, then a current flow results. In the other polarity the diode 8 blocks, so that no current flow arises. A short-circuit between the forward line 1 and the return line 12 can thus be recognized, because in the case of a short-circuit a current flow arises for both polarities of the test voltage.

If one of the safety switches 7, 20, 21 in the series 22 is open, then there is no current flow for both polarities of the test voltage. The closed electrical safety circuit 13 can thus be reliably differentiated from a short-circuit. A reliable detection thereby arises with regard to whether, for example, the door lock 15 (FIG. 5) is open. Disturbances or a fault-free state of the electrical safety circuit 13 can thus be detected by the interrogation device 5 and, for example, output in the form of a status signal to the control device 6.

Figure 4:
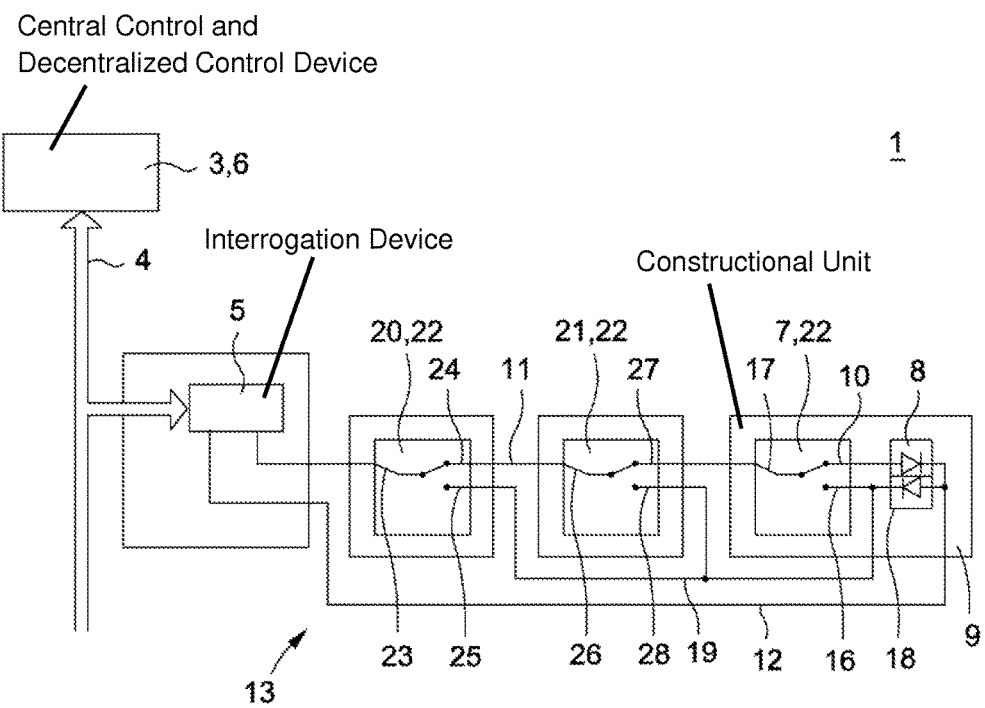
FIG. 4 shows a monitoring system for a passenger transport installation in a schematic illustration, in the manner of a detail, in correspondence with a fourth embodiment of the invention.

FIG. 4 shows a monitoring system for the passenger transport installation 2 (FIG. 5) in a schematic illustration in the form of a detail in correspondence with a fourth embodiment. In this embodiment, by contrast to the third embodiment described by way of FIG. 3, a bridging-over line 19 is additionally provided. In that regard, the first output 24 of the safety switch 20 is connected with the input 26 of the safety switch 21. The first output 27 of the safety switch 21 is connected with the input 17 of the safety switch 7. Moreover, the output 10 of the safety switch 7 is connected with the return line 12 by way of the diode 8.

The second output 25 of the safety switch 20, the second output 28 of the safety switch 21 and the second output 16 of the safety switch 7 are connected together by way of the bridging-over line 19. In addition, the second output 16 of the safety switch 7 is connected with the return line 12 by way of the further unit 18 with current direction dependence.

The first sequence of switch settings of the safety switches 7, 20, 21 is illustrated in FIG. 4. In the first sequence of switch settings, the uninterrupted forward line 11 is connected with the return line 12 by way of the unit 8 with current direction dependence, so that the electrical safety circuit 13 is, in this way, closed. In the case of application of the test voltage with alternating polarity a correspondingly reduced current signal thus arises with respect to the orientation of the diode 8. The orientation of the diode 8 thus causes a specific blocking behavior and pass behavior which can be interrogated by the test voltage with the alternating polarity. In every other sequence of switch settings at least one safety switch 7, 20, 21 of the series 22 is open. The unit 8 with current direction dependence is thus bridged over by way of the bridging-over line 19 and the further unit 18 with current direction dependence. The further unit 18 with current direction dependence thus lies in the then-closed current circuit, so that now exactly the opposite blocking behavior and pass behavior with respect to the polarities of the test signal arise.

In both the first sequence of switch settings and in another sequence of switch settings a conclusion about a disturbance, particularly a line breakage, can be made from the absence of a current signal in the case of both positive and negative polarity. This is appropriately evaluated by the interrogation device 5.

If, thereagainst, a current signal always arises with both positive polarity and negative polarity then a short-circuit between the forward line 11 and the return line 12 can be deduced. This is similarly evaluated by the interrogation device 5.

The difference between the first sequence of switch settings, which is illustrated in FIG. 4, and every other sequence of switch settings results from the test whether a current flow is detected only with positive polarity or only with negative polarity. It can thus be reliably detected whether the first sequence of the switch settings of the safety switches 7, 20, 21 is present, in which case influences due to disturbance can at the same time be excluded. Disturbances or a fault-free state of the electrical safety circuit 13 can thus be detected by the interrogation device 5 and output, for example, in the form of a status signal to the control device 6.

Figure 5:
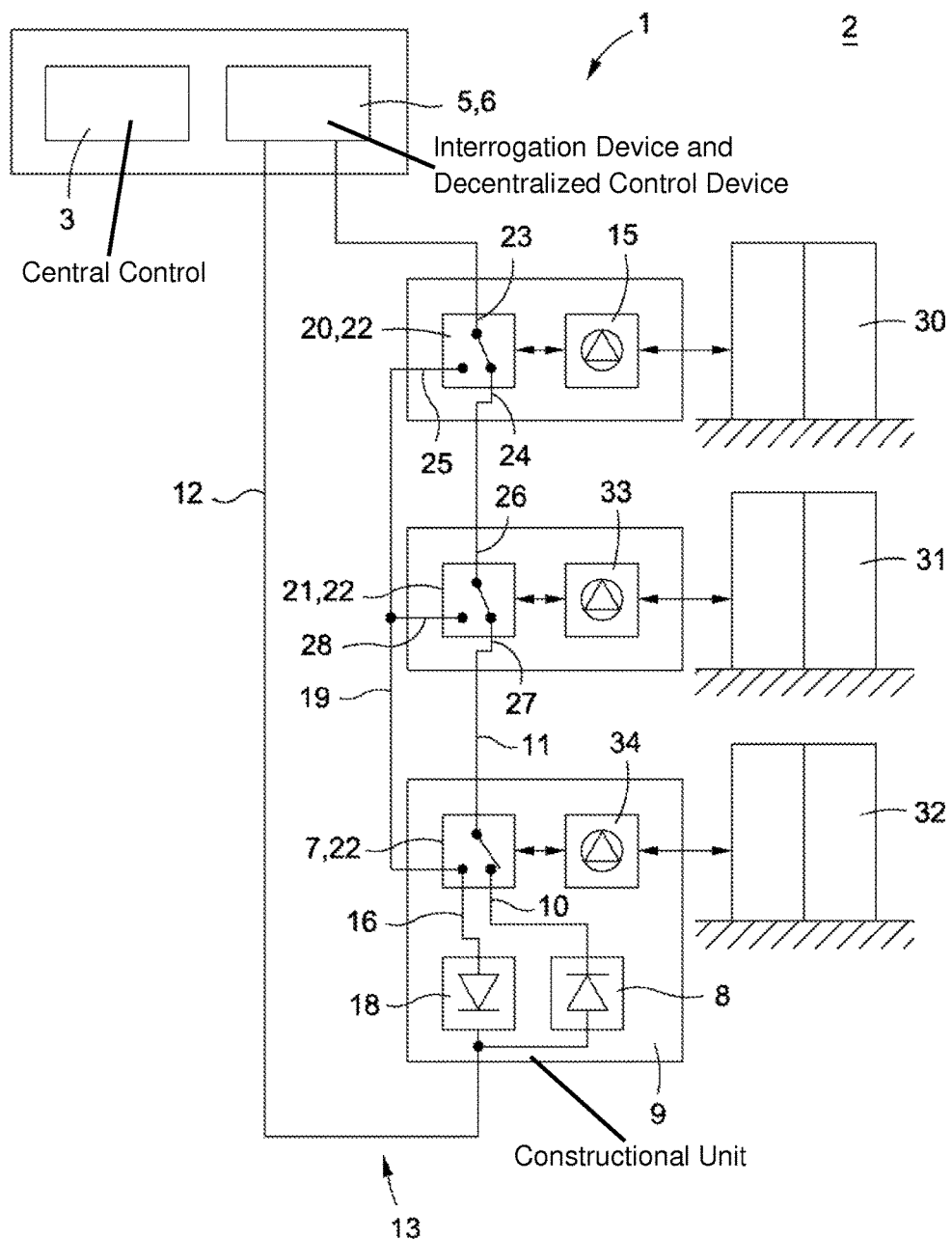
FIG. 5 shows a passenger transport installation with a monitoring system in correspondence with a fifth embodiment of the invention in a schematic illustration in the manner of a detail.

FIG. 5 shows a passenger transport installation 2 with a monitoring system 1 in correspondence with a fifth embodiment in a schematic illustration in the manner of a detail. In this embodiment a central interrogation device 5 is present, which is integrated in a central control device 6. In addition, the control device 6 is arranged at the central control 3. The control device 6 can also be integrated in the control 3. The control 3 is, in this embodiment, an elevator control 3.

The passenger transport installation 2 is constructed as an elevator installation 2 in this embodiment. In that regard, the elevator installation 2 has doors 30, 31, 32 on every floor. The item of equipment 15 is associated with the door 30. The item of equipment 15 is, in this embodiment, a triangle lock which can, for example, be opened by a service engineer. When the triangle lock 15 is opened the door 30 can be manually opened so that access to an elevator shaft is possible. In particular, a service engineer or a maintenance operative can thereby access the car roof of an elevator car. Accordingly, items of equipment 33, 34 designed as triangle locks 33, 34 are arranged. The triangle lock 33 is associated with the door 31. The triangle lock 34 is associated with the door 32.

One of the safety switches 7, 20, 21 is arranged at each triangle lock 15, 33, 34. The safety switches 7, 20, 21 can thereby also be integrated in the respective triangle lock 15, 33, 34.

In this embodiment, monitoring of several items of equipment 15, 33, 34, which are arranged at the interrogation device 5 and/or distributed over the floors, can be carried out by a single interrogation device 5.

In distinction from the embodiment described with reference to FIG. 5, in the case of the embodiments with reference to FIGS. 1 to 4 also several interrogation devices which correspond with the interrogation device 5, can be present. In that regard, a safety switch or a series of safety switches can be associated with each interrogation device.

Interrogation of the switch settings of the safety switches 7, 20, 21 and/or checking of the electrical safety circuit 13 can thus be carried out by interrogation, which is made by the interrogation device 5, of the electrical safety circuit 13. Depending on the respective design of the monitoring system 1 this can take place at the same time or displaced in time.

In the case of the described embodiments, for the sake of better understanding of the description consideration is given to inputs 17, 23, 26 and outputs 10, 16, 24, 25, 27, 28 of the safety switches 7, 20, 21. However, these references are made from the aspect of capability of understanding. The inputs can in terms of concept be equally termed outputs and conversely. Moreover, the safety switches 7, 20, 21 can also be modified. For example, in the case of a modified design use can also be made of buttons or rocker switches which oblige express resetting. Moreover, the safety switches 7, 20, 21 can, for example, also be based on an electrical, electronic, photoelectrical, electromagnetic or other mode of functioning or components with one of these modes of functioning can be used.

In addition, the interrogation device 5 can apply the test voltage in the form of an alternating voltage to the electrical safety circuit continuously or at specific intervals in time. In that regard, in particular, a test routine can be carried out in which in every switch setting to be tested or sequence of switch settings to be tested of the at least one safety switch 7, 20, 21 the test voltage with the alternating polarity is applied to the electrical safety circuit 13. In that case, a service engineer can selectively check the functional capability of the monitoring system 1. In particular, the function of the monitoring system 1 can be continuously checked in that not only the opening and closing of the respective item of equipment 15, 33, 34 is reliably monitored, but also disturbances, particularly a line breakage or a short-circuit, can be reliably recognized. The service engineer can simulate such disturbances in suitable manner during the test routine. For that purpose, in a given case also a short-circuit detector and an interruption detector can be integrated in the electrical safety circuit 13, which detectors are actuated by the service operative in correspondence with the sequence of the test routine.

In one embodiment of the monitoring system 1, as described on the basis of FIGS. 1 and 3, a disturbance which interrupts the electrical safety circuit 13 and which can be, for example, a line breakage can initially be treated as an opened safety switch 7, 20, 21. This means that the operation of the passenger transport installation 2 is interrupted. A service operative can then check whether an opened safety switch 7, 20, 21 or a disturbance is the cause of the operational interruption.

Moreover, in the case of the embodiments described by way of FIGS. 2, 4 and 5 recognition of a disturbance on the bridging-over line 19 is also made possible. If switching to a disturbed part of the bridging-over line 19 is carried out, then, for example, in the case of a line breakage the same behavior of the safety circuit, namely an interruption, is detected regardless of the polarity of the test voltage. Thus, even disturbances concerning the bridging-over line 19 can be recognized as soon as these are relevant.

The invention is not restricted to the described embodiments.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. A monitoring system for passenger transport installations, which installations are designed as an elevator, escalator or moving walkway, comprising:
   at least one interrogation device;
   at least one safety switch connected with the at least one interrogation device by an electrical safety circuit, the at least one safety switch monitoring an item of equipment of the passenger transport installation, wherein the at least one safety switch has a first switch setting and a second switch setting; and
   a unit with current direction dependence for checking the electrical safety circuit being arranged in the electrical safety circuit, wherein when a test voltage with alternating polarity is applied to the electrical safety circuit by the at least one interrogation device, at least one state of the electrical safety circuit, which is determinable in response to the test voltage, is detected by the at least one interrogation device and from the detected at least one state and a one of the first and second switch settings associated with the detected at least one state, at least one status signal is generated by the at least one interrogation unit, wherein the electrical safety circuit is closed by the unit with current direction in the first switch setting or in a first sequence of switch settings of the at least one safety switch.

2. The monitoring system according to claim 1 wherein the at least one interrogation device applies the test voltage as an alternating voltage to the electrical safety circuit continuously or at specific intervals in time.

3. The monitoring system according to claim 1 wherein a test routine for the at least one interrogation device is performed by a control device connected to the at least one interrogation device, in which test routine the test voltage with alternating polarity is applied to the electrical safety circuit in at least one of the first switch setting, the second switch setting and the first sequence of switch settings.

4. The monitoring system according to claim 1 wherein the unit with current direction dependence is arranged at the at least one safety switch in a forward line of the electrical safety circuit, and that in the first switch setting of the at least one safety switch the forward line is connected with a return line by the unit with current direction dependence for closing the electrical safety circuit.

5. The monitoring system according to claim 1 wherein the electrical safety circuit includes a plurality of safety switches connected in series including the at least one safety switch being a last safety switch in the series, the unit with current direction dependence being arranged at the at least one safety switch in a forward line of the electrical safety circuit, and that in the first switch setting of the at least one safety switch the forward line is connected with a return line by the unit with current direction dependence for closing the electrical safety circuit.

6. The monitoring system according to claim 5 wherein the forward line is interrupted in the second switch setting of the last safety switch or interrupted in another sequence of switch settings of the plurality of safety switches differing from the first sequence.

7. The monitoring system according to claim 6 wherein the at least one interrogation device is responsive to one polarity of the test voltage for checking whether all of the safety switches are closed or whether at least one of the safety switches is open, and is responsive to two polarities of the test voltage for checking whether a disturbance of the electrical safety circuit is present.

8. The monitoring system according to claim 1 including a further unit with current direction dependence arranged in the electrical safety circuit, wherein in the second switch setting of the at least one safety switch or in another sequence of switch settings of a series safety switches including the at least one safety switch differing from the first sequence a part of a forward line connected with the interrogation device is connected with a bridging-over line such that the unit with current direction dependence is bridged over and the bridging-over line is connected with a return line connected with the interrogation device by the further unit with current direction dependence.

9. The monitoring system according to claim 8 wherein the unit with current direction dependence and the further unit with current direction dependence block current flow through the return line in response to mutually opposite polarities of the test voltage respectively.

10. The monitoring system according to claim 8 wherein at least one of the unit with current direction dependence is arranged directly at a first output of the at least one safety switch, the further unit with current direction dependence is arranged directly at a second output of the at least one safety switch, the unit with current direction dependence is a diode and the further unit with current direction dependence is a diode.

11. The monitoring system according to claim 1 including a decentralized control device connected with a central control by a bus system, wherein the at least one interrogation device is integrated in the decentralized control device or the at least one interrogation device is arranged at the decentralized control device.

12. The monitoring system according to claim 1 including a central control device connected with the at least one interrogation device by a bus system, and wherein the at least one safety switch is arranged at the at least one interrogation device or remote from the at least one interrogation device.

13. A passenger transport installation, which installation is designed as an elevator, escalator or moving walkway, including a monitoring system according to claim 1, the item of equipment which is being monitored and the at least one safety switch.

14. A method of monitoring a passenger transport installation, which installation is designed as an elevator, escalator or moving walkway, wherein at least one item of equipment of the installation is monitored by at least one safety switch connected to an electrical safety circuit, comprising the steps of:
   arranging a unit with current direction dependence in the electrical safety circuit;
   determining a switch setting of or a sequence of switch settings of the at least one safety switch by applying a test voltage with an alternating polarity to the electrical safety circuit, wherein in the switch setting or the sequence of switch settings of the at least one safety switch the electrical safety circuit is closed by the unit with current direction dependence; and
   generating a status signal representing the determined switch setting or sequence of switch settings.

15. The method according to claim 14 wherein one polarity of the test voltage is used to determine whether the at least one safety switch is closed, another polarity of the test voltage is used to determine whether the at least one safety switch is open and both of the polarities of the test voltage are used to determine whether a disturbance of the electrical safety circuit is present.

* * * * *